United States Patent [19]

Lauverjat

[11] Patent Number: 5,604,354

[45] Date of Patent: Feb. 18, 1997

[54] MASKS FOR A DOUBLE-SIDE EXPOSURE MACHINE

[75] Inventor: Eric Lauverjat, Tours, France

[73] Assignee: SGS-Thomson Microelectronics S.A., Saint Genis Pouilly, France

[21] Appl. No.: 231,625

[22] Filed: Apr. 22, 1994

[30] Foreign Application Priority Data

Apr. 27, 1993 [FR] France .................................. 93 05312

[51] Int. Cl.⁶ ...................................................... G01V 9/04
[52] U.S. Cl. ............................ 250/548; 356/400; 355/53
[58] Field of Search .................................... 250/548, 202; 356/399–401; 355/23, 24, 26, 53

[56] References Cited

U.S. PATENT DOCUMENTS

| | | |
|---|---|---|
| 4,764,791 | 8/1988 | Omata et al. . |
| 4,811,062 | 3/1989 | Tabata et al. . |
| 4,835,078 | 5/1989 | Harvey et al. ........................... 250/548 |
| 5,170,058 | 12/1992 | Berasi et al. ............................ 356/401 |
| 5,216,257 | 6/1993 | Brueck et al. ........................... 250/548 |
| 5,414,514 | 5/1995 | Smith et al. ............................. 356/401 |

FOREIGN PATENT DOCUMENTS

| | | | |
|---|---|---|---|
| 2181165 | 11/1973 | France .............................. G05D 3/00 |
| 9109767 | 10/1991 | Germany .......................... G03F 9/00 |

OTHER PUBLICATIONS

Solid State Technology, Aug. 1978, USA, 21, 8, 55–60, R. A. Heinz, et al., "Double–Sided Photolithography".

*Primary Examiner*—Stephone Allen
*Attorney, Agent, or Firm*—David M. Driscoll; James H. Morris; John N. Anastasi

[57] ABSTRACT

A pair of masks is designed to expose an upper surface and a lower surface of a silicon wafer. Each mask includes, outside its operative surface area, corresponding to the surface of the silicon wafer, identical or complementary sighting marks.

19 Claims, 4 Drawing Sheets

MASKS FOR A DOUBLE-SIDE EXPOSURE MACHINE

BACKGROUND OF THE INVENTION

1. Field of the Invention

The present invention relates to the fabrication of semiconductor components, and more particularly to machines for masking and exposing semiconductor wafers on both a front and a rear surface.

2. Discussion of the Related Art

In the field of semiconductor manufacturing, one of the basic operations is forming masking layers on semiconductor wafers. Such masking layers are obtained by depositing on the wafer surface a layer of a photosensitive material, hereinafter referred to as a resist, that is exposed through a selected mask, the resist being such that its exposed portions subsequently have etching properties that are selective with respect to the non exposed portions.

Conventionally, semiconductor wafers are subject to masking operations on only one of the front or rear surfaces. However, in some devices, for example in power components, masking operations must be carried out on both the front surface and rear surface of the wafer. For this purpose, masking and exposure machines that provide simultaneous exposure, through selected masks, of both the front and rear surfaces of a wafer, have been developed. Such masks have to be aligned with the wafers, as well as with the masks used during previous masking steps.

To achieve this purpose there is formed on the wafer and on each mask, alignment marks (or keys) that allow for the appropriate positioning of the masks with respect to each other and with respect to the wafer prior to carrying out an exposure step.

By way of example, FIGS. 1A, 1B and 1C are a bottom view of an upper mask 1, a bottom view of a silicon wafer 2, and a top view of a lower mask 3, respectively. Each mask includes an operative area, 5 and 6, respectively, that corresponds to the surface area of wafer 2. Each operative area has been drawn cross-ruled because a mask commonly includes a plurality of identical etching patterns that are repeated in order to simultaneously form identical etching patterns on the wafer which is subsequently partitioned into a plurality of identical chips. An etching pattern is for example within a square M1 on mask 1 and within a square M3 on mask 3. The masks further include determined areas reserved for test patterns or alignment patterns. Such alignment patterns are illustrated as crosses labeled as K1 on mask 1, K2 in wafer 2 and K3 on mask 3. Generally, each mask includes two alignment patterns K. The alignment patterns K2 formed on the wafer result from successive etching operations on the wafer.

FIG. 2 schematically represents a portion of an overall structure of a prior art exposure machine which is, for example, fabricated by Karl Suss company (Suss MA 25). In this machine, the lower mask 3 is held by a first support 10 whose translation and orientation (X, Y, Θ) can be adjusted with respect to a second support 11, whose translation and rotation are in turn adjustable with respect to the frame 12 of the machine. The upper mask 1 is fixed through a set of telescopic rods 14 (one of which only is shown) to the second support 11, so that mask 1 can be moved parallel with respect to itself and to mask 3 to allow movement away from or closer to mask 3. A conveying arm 16 allows for the introduction of wafer 2 between masks 1 and 3, for maintaining the wafer in close vicinity to mask 3, and for laying the wafer upon mask 3. A first optical system projects a parallel exposure light beam 20 onto the wafer through the upper mask 1; a second optical system projects a parallel exposure light beam 21 onto the wafer through the lower mask 3.

The alignment mode of the masks in this machine is schematically illustrated in FIGS. 3A, 3B and 3C.

As shown in FIG. 3A, during a first step, before the silicon wafer 2 is introduced between the upper and lower masks, the telescopic rods 14 are activated so that mask 1 is disposed, with respect to mask 3, substantially at a position it will occupy once the wafer is introduced and immediately prior to the exposure step. Then, by following an optical path, that corresponds for example to the path of the light beam 21, a user examines through a microscope the alignment of keys K1 and K3 and acts on the position of support 10 with respect to support 11 to obtain the desired alignment between the masks.

During a second step, illustrated in FIG. 3B, mask 1 is raised by acting on the telescopic rods 14 and wafer 2 is introduced over and in the close vicinity of mask 3 by the conveying arm 16. Then, with the same microscope as previously used, the keys K3 of the lower mask are aligned with respect to the alignment keys K2 of the wafer by an X, Y and Θ adjustment of support 11 with respect to base 12. It will be noted that during this adjustment, masks 1 and 3, that are linked by rods 14, are simultaneously moved by the same values such that they remain within the alignment as set by step 1. Then wafer 2 is laid upon mask 3, the conveying arm 16 is removed, and the upper mask is moved closer to the wafer. The alignment operation being thus completed, the wafer is ready to be exposed on both the front and rear surfaces.

A problem with this method and apparatus according to the prior art is that once the system is ready for exposure, as shown in FIG. 3C, it is not possible to check the alignment between keys K1 and K3 since wafer 2 cuts off the optical path between these marks.

In practice, users have noticed that machines such as above described generally operate suitably. However, sometimes, misaligned sequences of exposures occur. Such a misalignment is often a result of a shift of mask 1 while it is moved upward and downward.

SUMMARY OF THE INVENTION

An object of the present invention is to provide a simple system for detecting such a misalignment.

To achieve this object, the invention provides a pair of masks that are designed to expose the upper surface and the lower surface of a silicon wafer. Each mask includes, outside its operative area corresponding to the surface of the silicon wafer, identical or complementary sighting marks.

The sighting marks are, for example, opaque and transparent checkerboard patterns or concentric rings.

Another object of the invention is to provide a machine for exposing the front and rear surfaces of a silicon wafer that is coated with a photosensitive resist, through a first and a second mask that are disposed on each side of the wafer. The machine includes alignment marks in register on the wafer and each mask; means for moving apart the first and second masks; means for introducing the wafer between the two masks; means for translating and adjusting the first mask with respect to the second mask; and means for translating and adjusting the combination of the two masks with respect to the wafer. The two masks further include, outside their operative area, additional transparent and opaque patterns. The machine further includes at least one light source and a photoreceptor that are disposed so that the optical path between them passes through a pattern of each mask, whereby the photodetector detects an extreme light intensity when the masks are aligned.

According to an embodiment of the invention, the additional transparent and opaque patterns are complementary and are shaped like a checkerboard.

According to an embodiment of the invention, the additional transparent and opaque patterns are identical and are shaped like concentric rings.

The foregoing and other objects, features, aspects and advantages of the invention will become apparent from the following detailed description of the present invention when taken in conjunction with the accompanying drawings.

DETAILED DESCRIPTION

Figure 4:
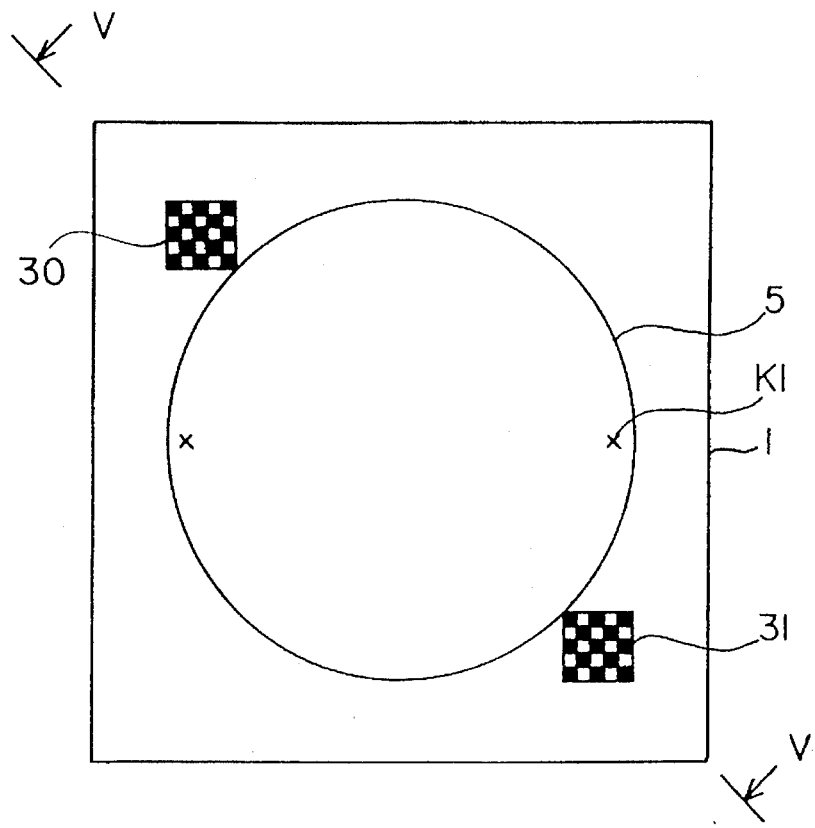
FIG. 4 represents a mask modified according to an embodiment of the invention.

The upper mask 1 modified according to an embodiment of the invention is illustrated in FIG. 4 and includes, outside the operative area 5, patterns or sighting marks comprising opaque and transparent areas 30, 31, that are, for example, diagonally disposed, as shown. The lower mask also includes, located at the same positions, complementary sighting marks. Thus, when the two masks are aligned, further to alignment of their keys K1 and K3, the superposition of upper and lower sighting marks forms an opaque screen. In addition, as soon as one of the masks is misaligned with respect to the other mask, a light beam can pass through the two superposed sighting marks.

Figure 1A:
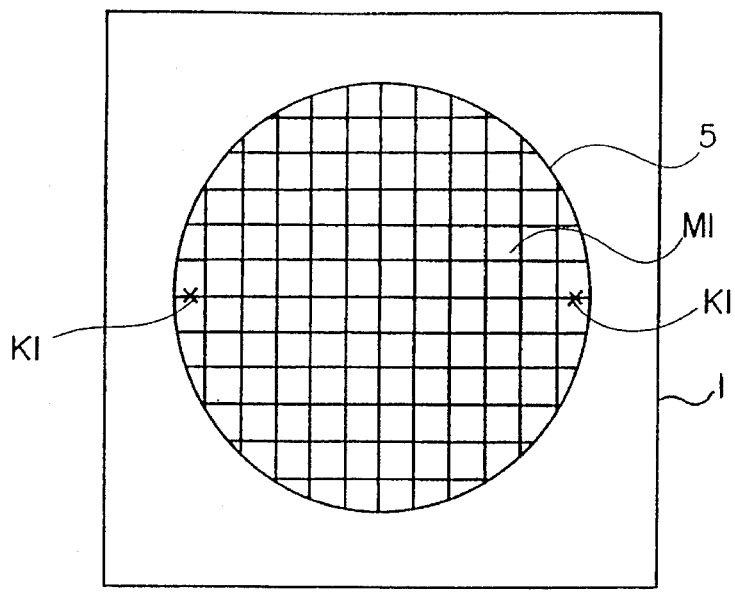
FIGS. 1A, 1B and 1C represent an upper mask, a silicon wafer, and a lower mask, respectively.
Figure 1B:
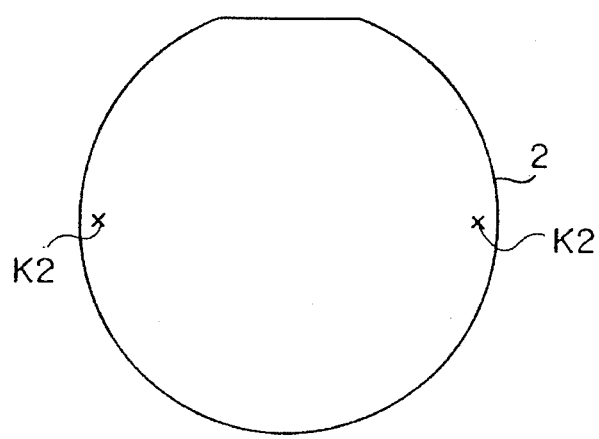
Figure 1C:
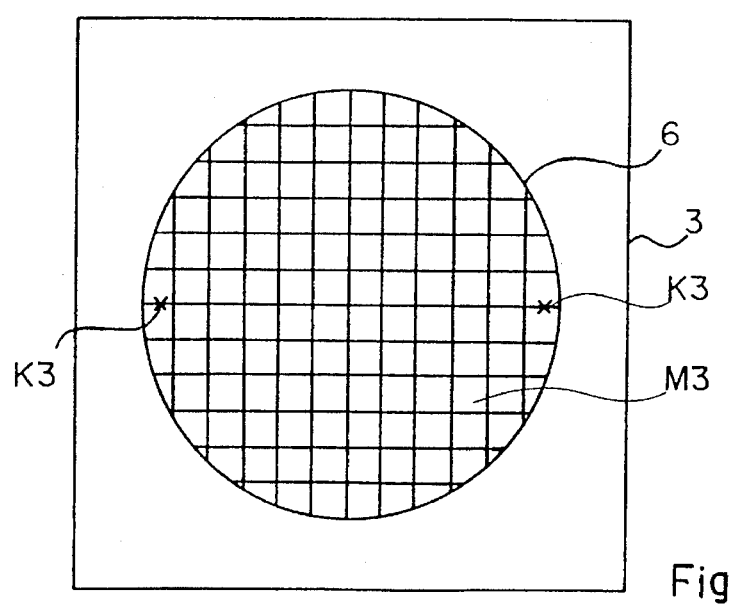
Figure 2:
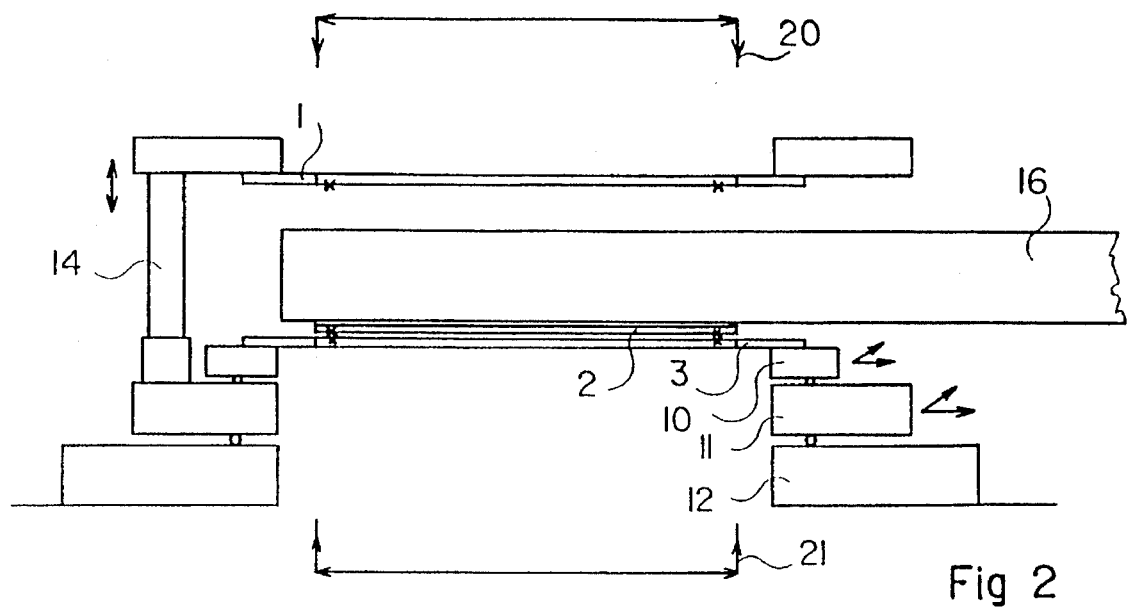
FIG. 2 represents the mask alignment system of a conventional exposure machine.
Figure 3A:
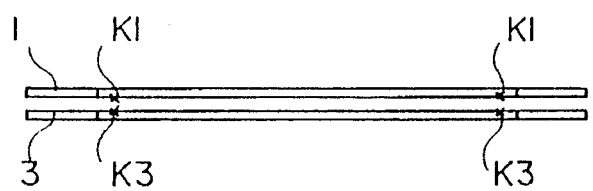
FIGS. 3A, 3B and 3C illustrate successive alignment of masks using the machine of FIG. 2.
Figure 3B:
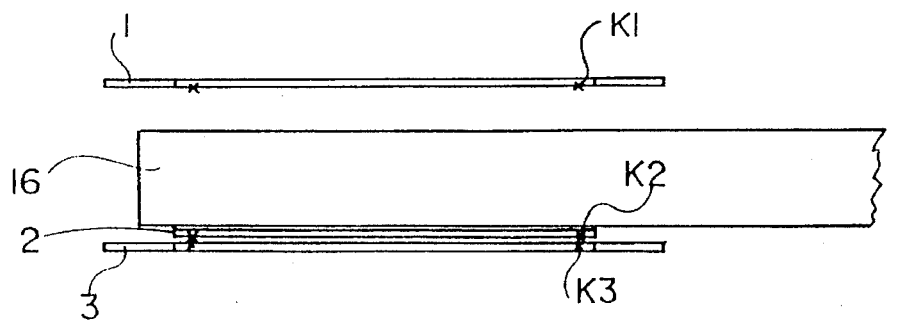
Figure 3C:
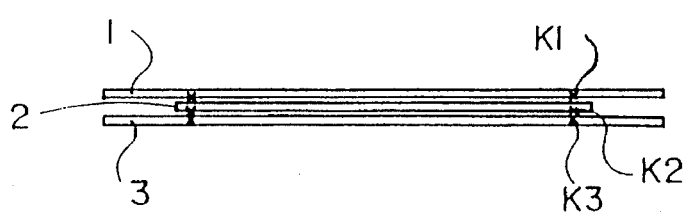

Accordingly, the present invention uses, in a machine such as the one of FIG. 2, masks such as the one represented in FIG. 4 and the exposure machine further includes an optical means for detecting the alignment or misalignment of the sighting marks of the upper and lower masks.

Figure 5:
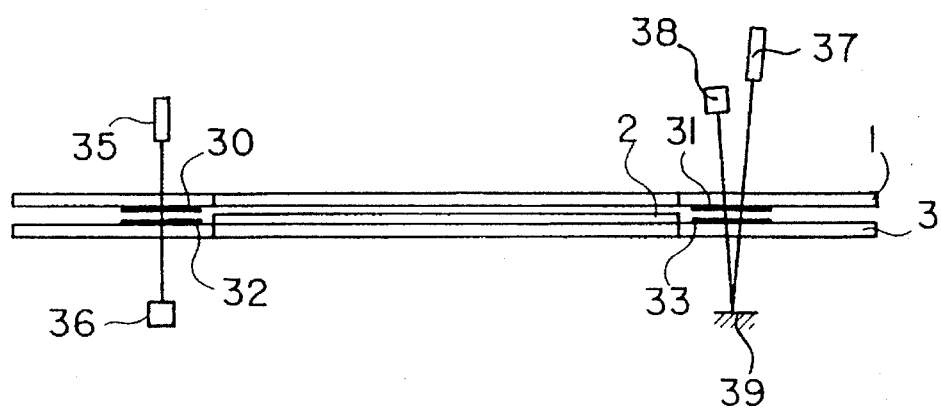
FIG. 5 represents a system for the detection of misaligned masks according to the invention.

FIG. 5 is a cross-sectional view, drawn along the diagonal line V—V of FIG. 4, of the combination of the upper mask 1, a wafer 2 and a lower mask 3 positioned to expose the wafer 2. The upper mask includes sighting marks 30 and 31, and the lower mask includes complementary sighting marks 32 and 33. A device for the optical detection of alignment of sighting marks 30–32 and 31–33, as represented in the left-hand portion of FIG. 5, includes a photo-emitter 35, such as a laser diode, in front of which a photoreceptor 36 such as a photo-diode is disposed. It is also possible to dispose, as represented in the right-hand portion of FIG. 5, a second photo-emitter 37 and a second photo-receptor 38 on the same side of the assembly to be exposed, for example, over the upper mask 1, such that the light is reflected by a mirror 39 if the sighting marks 31 and 33 are shifted out of alignment.

As is shown in FIG. 4, the sighting marks 30 can have a checkerboard pattern, the size of each case being about 1 to 5 μm, which is sufficient to detect a variation larger than 0.5 μm. If, with the monitoring system according to the invention, a misalignment is detected between the upper mask and the lower mask, the mask alignment steps described with reference to FIG. 2 and FIGS. 3A–3C are resumed. Preferably, the device according to the invention is used only as a misalignment detection device and not as a means for the realignment of masks.

The system according to the invention can be easily adapted to existing double-side exposure machines in which the systems for gripping the masks, usually vacuum systems, overlap with respect to the periphery of these masks but always leave in practice a free area between the operative limit of the mask (corresponding to the surface area of the silicon wafer) and its periphery. In addition, there are miniaturized laser diodes and photosensitive diodes that can be easily disposed in free spaces of the machine. Preferably, the monitoring according to the invention is automatically carried out by a robot that controls the exposure machine and verifies the masks' alignment at the end of the conventional alignment steps by rapidly activating the laser diodes and detecting the light received. Of course, a light threshold is to be determined in order to detect a minimum adjustment. Additionally, the surface areas of the ckeckerboard pattern opaque areas may be slightly larger than the surface areas of the clear area in order not to perform detection steps beyond a predetermined misalignment level and to account for edge effects.

Figure 6:
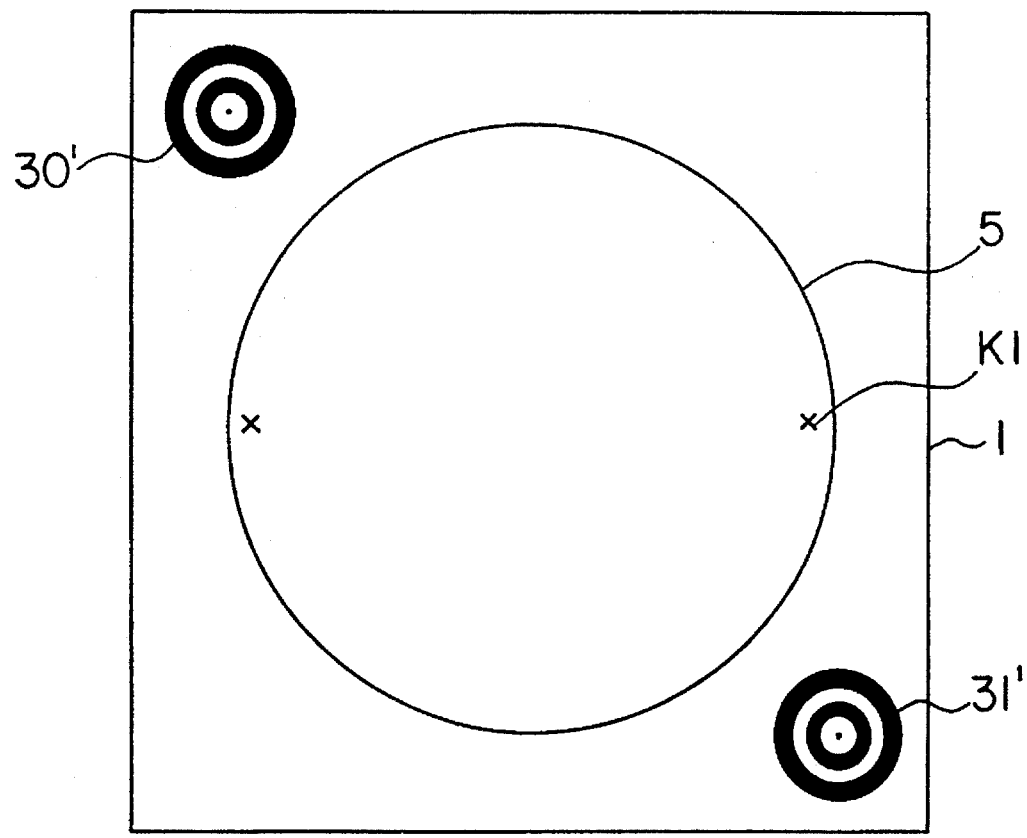
FIG. 6 illustrates a mask having concentric ring sighting marks according to an embodiment of the invention.

Furthermore, in the above described embodiment of the present invention, complementary checkerboard sighting marks are proposed. Any other form of complementary sighting marks can be used. Also, instead of using complementary sighting marks, identical sighting marks can be used. Thus, instead of a minimum light level, a maximum light level will be detected. These identical sighting marks can, for example, have the shape of concentric rings that are alternatively opaque and transparent, as shown in FIG. 6.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A pair of mask plates designed to expose an upper surface and a lower surface of a silicon wafer wherein each mask plate includes, outside an operative surface area corresponding to a surface area of the silicon wafer, sighting marks.

2. The pair of mask plates according to claim 1, wherein said sighting marks on each mask plate include opaque and transparent checkerboard patterns.

3. The pair of masks according to claim 1, wherein said sighting marks on each mask plate include opaque and transparent concentric rings.

4. The pair of mask plates according to claim 1, wherein the sighting marks on each mask plate are identical.

5. The pair of mask plates according to claim 1, wherein the sighting marks on each mask plate are complimentary.

6. A machine for exposing a first and a second side of a silicon wafer, that is coated with a photosensitive resist, through a first and a second mask disposed on the first and the second side of the wafer, respectively, including:

means for moving apart the first and the second masks;

means for introducing the wafer between the first and the second masks;

means for translating and adjusting the first mask with respect to the second mask;

means for translating and adjusting the first and the second masks with respect to the wafer;

wherein the first and the second masks include, alignment keys and transparent and opaque sighting patterns which are outside an operative surface area of the mask which corresponds to the wafer surface area; and at least one light source and photoreceptor that are disposed such that an optical path between the light source and photoreceptor passes through the transparent and opaque sighting patterns of each mask.

7. The exposure machine according to claim 6, wherein the transparent and opaque sighting patterns on the first and second masks are identical.

8. The exposure machine according to claim 7, wherein the photodetector detects a maximum light intensity when the first and second masks are aligned.

9. The exposure machine according to claim 6, wherein the transparent and opaque sighting patterns on the first and second masks are complementary.

10. The exposure machine according to claim 9, wherein the photodetector detects a minimum light intensity when the first and second masks are aligned.

11. The exposure machine according to claim 6, wherein the light source is a laser diode.

12. The exposure machine according to claim 6, wherein the photoreceptor is a photosensitive diode.

13. The exposure machine according to claim 6, wherein said transparent and opague sighting patterns are in the form of a checkerboard.

14. The exposure machine according to claim 6, wherein said transparent and opaque sighting patterns are in the form of concentric rings.

15. The exposure machine according to claim 13, wherein the sighting marks are in a range of 1–5 micrometers on a side.

16. The exposure machine according to claim 13, wherein a surface area of the opaque checkerboard patterns is slightly larger than a surface area of the clear checkerboard patterns.

17. A pair of mask plates designed to expose an upper surface and a lower surface of a wafer wherein each mask plate includes, outside an operative surface area corresponding to a surface area of the wafer, citing marks which include opaque and transparent checkerboard patterns, wherein the size of the sighting marks is in a range of 1–5 micrometers on a side.

18. A pair of mask plates designed to expose an upper surface and a lower surface of a wafer wherein each mask plate includes, outside an operative surface area corresponding to a surface area of the wafer, citing marks which include opaque and transparent checkerboard patterns, wherein a surface area of the opaque checkerboard patterns are slightly larger than a surface area of the transparent checkerboard patterns.

19. A method for aligning and detecting misalignment of a silicon wafer, having a top and a bottom side, with a first and a second mask opposing the top and the bottom side of the wafer, respectively, comprising the steps of:

aligning the first mask disposed above the second mask in a position with respect to the second mask that the first mask will substantially occupy during exposure of the first and second sides of wafer;

moving the first mask upward, with respect to the second mask;

introducing the wafer between the first and second masks and aligning the second mask with respect to the bottom side of the wafer;

moving the first mask towards the top side of the wafer;

detecting any misalignment between the first mask and the second mask using a light source and a photosensor.

* * * * *